(12) United States Patent
Lee

(10) Patent No.: US 7,133,284 B2
(45) Date of Patent: Nov. 7, 2006

(54) POWER SUPPLY WITHOUT COOLING FAN

(75) Inventor: Kenny Lee, San Chung (TW)

(73) Assignee: Etasis Electronics Corporation, Taipei Hsien (TW)

( * ) Notice: Subject to any disclaimer, the term of this patent is extended or adjusted under 35 U.S.C. 154(b) by 260 days.

(21) Appl. No.: 10/685,509

(22) Filed: Oct. 16, 2003

(65) Prior Publication Data

US 2005/0083660 A1 Apr. 21, 2005

(51) Int. Cl.
*H05K 7/20* (2006.01)

(52) U.S. Cl. ............... 361/697; 361/797; 361/701; 361/709; 361/710

(58) Field of Classification Search ............... 361/797, 361/697, 701, 702, 703, 704, 709, 719, 736; 174/252; 165/80.3, 80.4; 257/715
See application file for complete search history.

(56) References Cited

U.S. PATENT DOCUMENTS

| | | | |
|---|---|---|---|
| 5,170,336 A * | 12/1992 | Getter et al. ............... | 363/141 |
| 5,842,514 A * | 12/1998 | Zapach et al. ............. | 165/104.33 |
| 6,894,900 B1 * | 5/2005 | Malone ....................... | 361/700 |
| 2004/0085733 A1 * | 5/2004 | Leon et al. .................. | 361/700 |
| 2004/0184236 A1 * | 9/2004 | Lee ............................. | 361/697 |
| 2005/0011199 A1 * | 1/2005 | Grisham et al. ............. | 62/3.7 |

* cited by examiner

*Primary Examiner*—Kamand Cuneo
*Assistant Examiner*—Ivan Carpio
(74) *Attorney, Agent, or Firm*—Troxell Law Office, PLLC

(57) ABSTRACT

The invention provides a power supply for a computer mainframe, which is cooled by a heat conduction method, and more particularly to a power supply without a cooling fan. The present invention features a highly effective heat pipe connecting a plurality of aluminum-extrusion heat sink fins and a plurality of aluminum-extrusion heat sinks, the aluminum-extrusion heat sink fins fixed above a cooling chip over a circuit board, and the aluminum-extrusion heat sinks fringed near the power supply, with a part of the heat sink fins exposed to the power supply. The heat of a chip is conducted out of the power supply by the aluminum-extrusion heat sink fins, the high-effect heat pipe, and the aluminum-extrusion heat sinks. Therefore, the power supply can reach an expected cooling effect without the cooling fan.

6 Claims, 3 Drawing Sheets

POWER SUPPLY WITHOUT COOLING FAN

BACKGROUND OF THE INVENTION

1. Field of the Invention

The invention relates in general to a cooling technique field of a power supply for a computer, and more particularly to a cooling device for a power supply, which can reach an expected cooling effect without the cooling fan. The present invention features in a high-effect heat pipe connecting a plurality of aluminum-extrusion heat sink fins and a plurality of aluminum-extrusion heat sinks, the aluminum-extrusion heat sink fins fixed above a cooling chip over the circuit board, and the aluminum-extrusion heat sinks fringed near the power supply, with a part of the heat sink fins exposed to the power supply. The heat of a chip is conducted out of the power supply by the aluminum-extrusion heat sink fins, the high-effect heat pipe, and the aluminum-extrusion heat sinks.

2. Description of the Related Art

Along with the popularization of computers in the market, every operation job has become more facilitated. And also with the continuous advancement and upgrading of every component of computer equipment, a computer system can process more and more software and data. Therefore, the ascending temperature of related parts of the computer and disturbing noise by a heat sink fan in order to cool the heat becomes a future problem.

In order to supply required power for operation of system devices inside a computer, the general computer mainframe is installed with a power supply. The power supply works on transforming general alternating current (A.C.) into required stable direct current (D.C.) for every part. Both switching power supply and the computer system need a stable and reliable heat sink system to maintain normal functions. Usually, when the power supply works on transforming A.C. to D.C., it causes an ascending temperature effect. In addition, noise by a heat sink fan in order to cool the heat becomes a disturbing problem.

For general power supply, cooling chips are installed with stand-up heat sink fins, which are mostly of aluminum-extrusion mold. In addition, a cooling fan is fringed inside the power supply near the external housing thereof. The contact and heat conduction of the heat sink fins and the chips, and also cold air generated by the fan is conducted to sway the heat sink fins, so as to cool down and prevent unbalance or damage from the ascending temperature of the power supply. It may be not a problem for those power supplies requiring low watts, however, for those power supplies requiring high quality and high wattage with strict demands no crashes are allowed when the computer is executing programs, this is difficult to reach.

SUMMARY OF THE INVENTION

In view of the above-mentioned disadvantages, it is therefore the object to provide a power supply without a cooling fan. The present invention includes a plurality of aluminum-extrusion heat sink fins fixed above a cooling chip inside the power supply, a high-effect heat pipe connecting a plurality of aluminum-extrusion heat sink fins and a plurality of aluminum-extrusion heat sinks, and the aluminum-extrusion heat sinks fringed near the power supply, with a part of the heat sink fins exposed to the power supply. Heat of a chip can be absorbed by the aluminum-extrusion heat sink fins, and they are also conducted to the heat sink fins by the high-effect heat pipe immediately, so that not only the heat is conducted out of the power supply, but also the aluminum-extrusion heat sinks take a cooling effect. Therefore, the power supply can reach an expected cooling effect without the cooling fan.

The present invention of the power supply without a cooling fan truly can reach the expected cooling effect after a test. With reference to FIG. 5, it shows a temperature distribution of cooling in the present invention, which proves that the invention can exactly reach the expected cooling to promote efficiency. Accordingly, the present invention includes the following advantages:

First, the power supply does not need the cooling fan, which can reduce production cost obviously, decrease assembling and procedures of power connection.

Second, the power supply without the cooling fan can decrease extra consumption of power.

Third, no excessive high temperature would occur due to fan malfunction.

Fourth, there is no disturbing noise due to the operation of the fan.

To conclude from the above description, the present invention makes efforts in research and development to improve conventional deficiency of the power supply. Therefore, the power supply with stable cooling function is provided.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
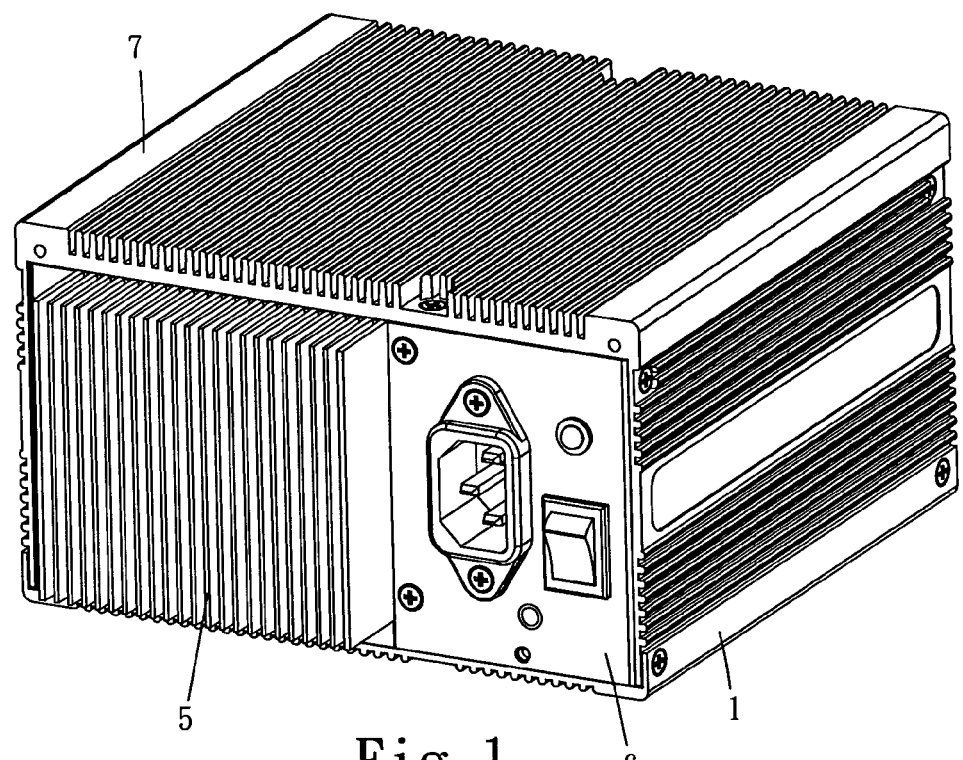
FIG. 1 is a three-dimensional diagram viewed from the front of the present invention.

The present invention of a power supply without a cooling fan includes a base (1), a circuit board (2), an plurality of aluminum-extrusion heat sink fins (3) (3'), a high-effect heat pipe (4), a plurality of aluminum-extrusion heat sinks (5), a panel board (6), an outer decking (7), and a back panel (8), so as to compose the power supply.

Figure 4:
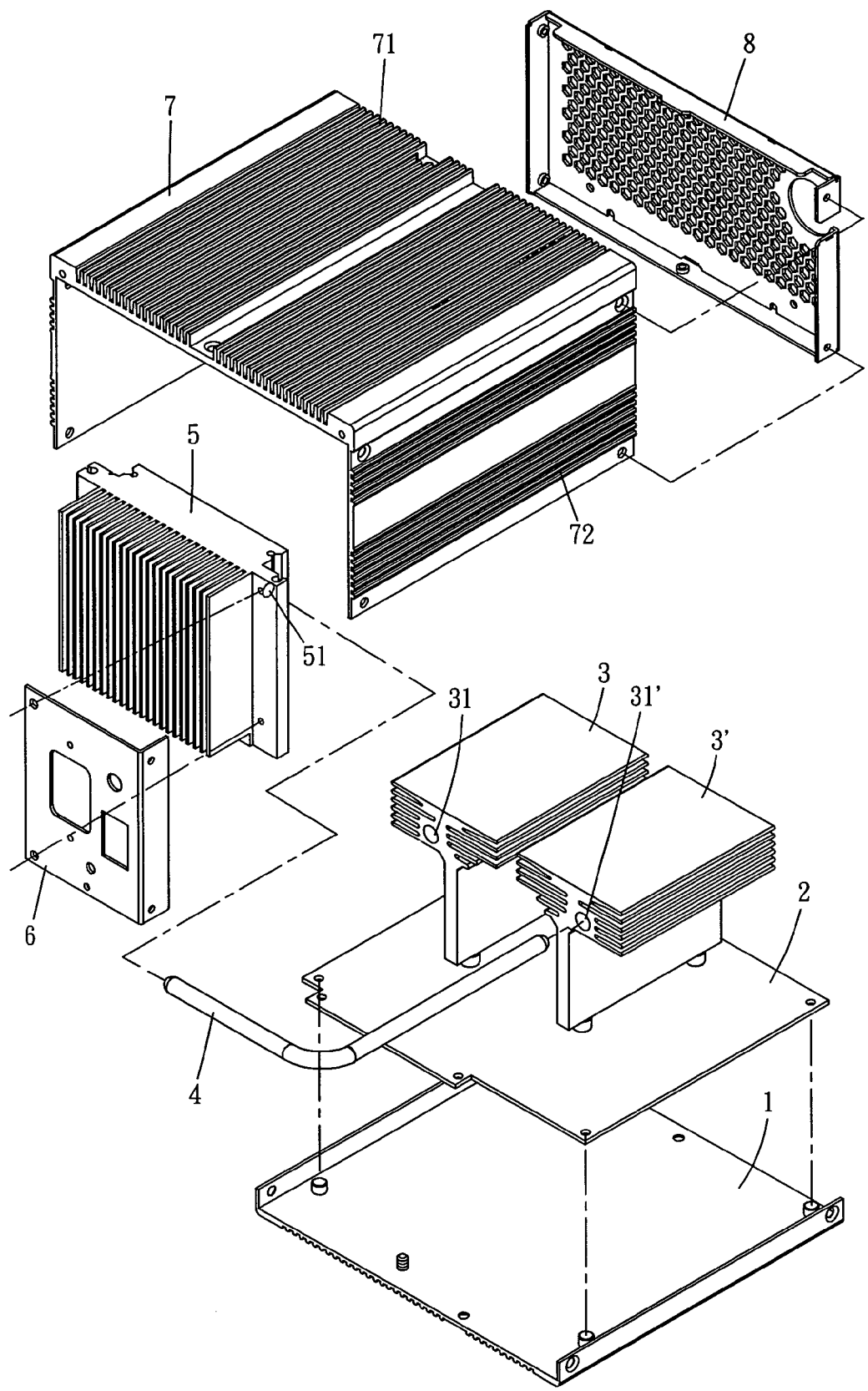
FIG. 4 shows a decomposition diagram of the main parts of the present invention.

With reference to FIG. 4, the aluminum-extrusion heat sink fins (3) (3') and the aluminum-extrusion heat sinks (5) are connected through the penetrating holes (31) (31') (51) by the high-effect heat pipe (4). Accordingly, the heat of a chip of the circuit board (2) can be absorbed by the aluminum-extrusion heat sink fins (3) (3'), and also is conducted to the heat sinks (5) exposed to the power supply by the high-effect heat pipe (4) immediately, so that not only the heat is conducted out of the power supply, but also the aluminum-extrusion heat sinks take a cooling effect. Therefore, the power supply can reach an expected cooling effect without the cooling fan.

With reference to FIG. 4, the aluminum-extrusion heat sink fins (3) (3') and the aluminum-extrusion heat sinks (5)

are connected through the penetrating holes (31) (31') (51) by the high-effect heat pipe (4). Accordingly, the heat of a chip of the circuit board (2) can be absorbed by the aluminum-extrusion heat sink fins (3) (3'), and also is conducted to the heat sinks (5) exposed to the power supply by the high-effect heat pipe (4) immediately, so that not only the heat is conducted out of the power supply, but also the aluminum-extrusion heat sinks take a cooling effect. Therefore, the power supply can reach an expected cooling effect without the cooling fan. FIG. 5 shows a temperature distribution of cooling effect of the present invention.

Figure 2:
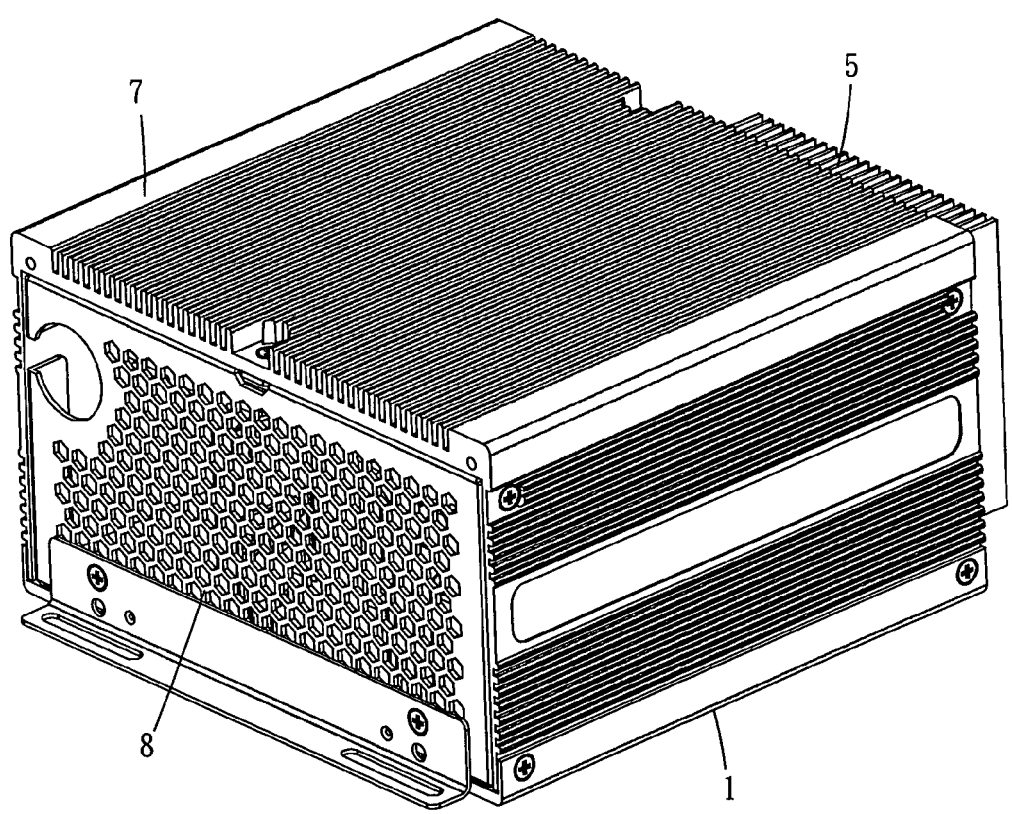
FIG. 2 is a three-dimensional diagram viewed from the back of the present invention.
Figure 3:
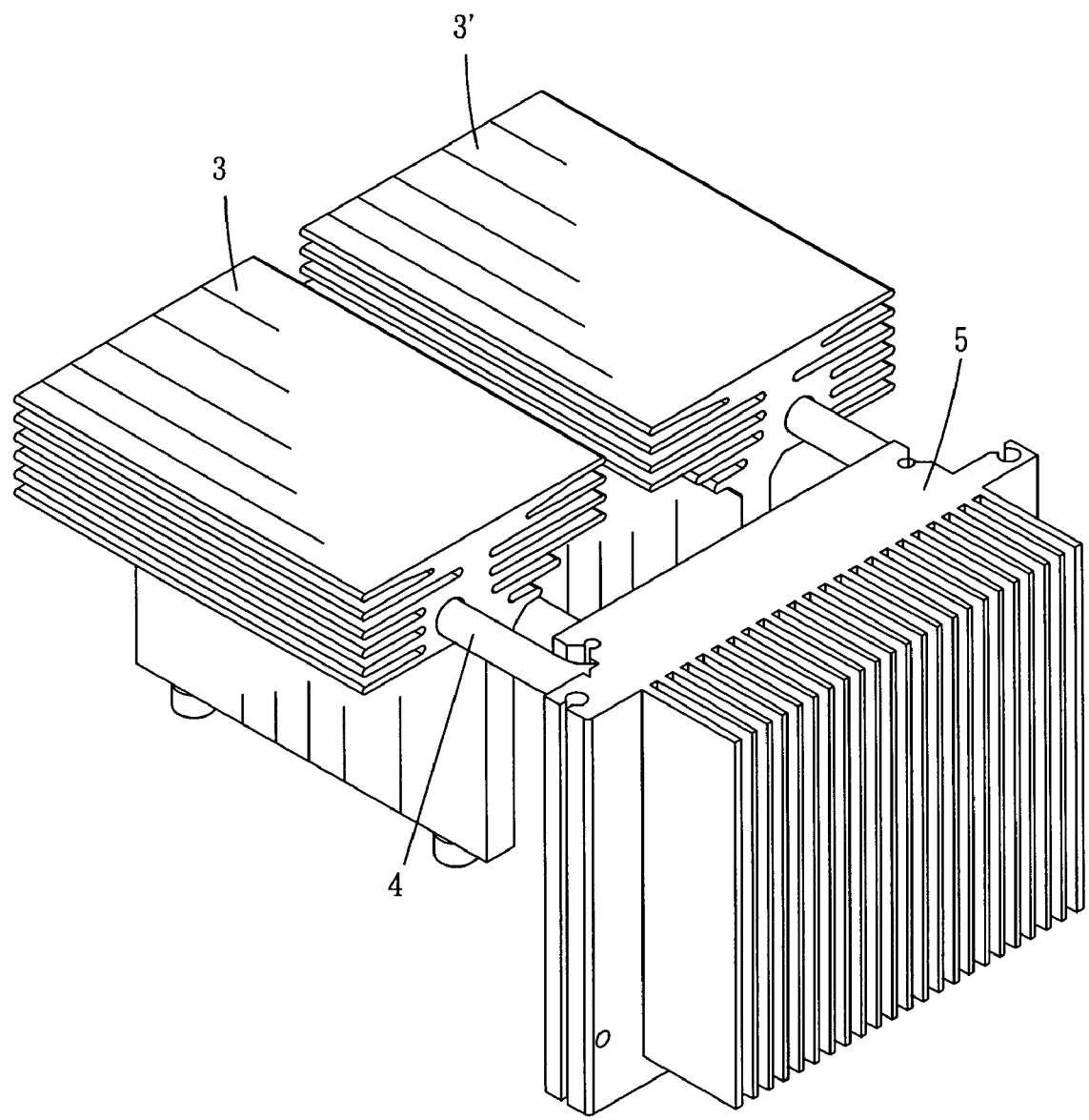
FIG. 3 shows a three-dimensional diagram of a related location of the aluminum-extrusion heat sink fins, the aluminum-extrusion heat sinks, and the high-effect heat pipe of the present invention.

With reference to FIG. 1, FIG. 2, and FIG. 3, together with the power supply without the cooling fan of the present invention, dispersed heat sink fins (71) (72) can be installed above and aside the outer decking (7) to increase the entirety of the cooling effect.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed:

1. A power supply without a cooling fan comprising:
a) a base;
b) a circuit board located above the base and having a chip;
c) a plurality of interior heat sinks located above the circuit board, each of the plurality of interior heat sinks having a plurality of fins;
d) at least one outer heat sink having a plurality of fins;
e) a plurality of heat pipes, the at least one outer heat sink is connected to each of the plurality of interior heat sinks by one of the plurality of heat pipes;
f) a panel board, the at least one outer heat sink and the panel board are located on a front thereof;
g) an outer decking connected to the base and covering the circuit board, the plurality of interior heat sinks, and a covered portion of the at least one outer heat sink; and
h) a back panel located on a back thereof,
wherein heat from the chip is absorbed by the plurality of interior heat sinks and transferred to the at least one outer heat sink by the plurality of heat pipes.

2. The power supply according to claim 1, wherein the at least one outer heat sink has an exposed portion communicating with an exterior of the front.

3. The power supply according to claim 1, wherein the at least one outer heat sink is located adjacent to the panel board.

4. The power supply according to claim 1, wherein the plurality of fins of each of the plurality of interior heat sinks and the at least one outer heat sink are extruded aluminum.

5. The power supply according to claim 1, wherein the outer decking includes two spaced apart sets of heat fins.

6. The power supply according to claim 1, wherein each of the plurality of fins of each of the plurality of interior heat sinks and the at least one outer heat sink has a penetrating hole, an end of one of the plurality of heat pipes is inserted into each penetrating hole.

* * * * *